United States Patent [19]

Tounai

[11] Patent Number: 5,627,083
[45] Date of Patent: May 6, 1997

[54] METHOD OF FABRICATING SEMICONDUCTOR DEVICE INCLUDING STEP OF FORMING SUPERPOSITION ERROR MEASURING PATTERNS

[75] Inventor: Keiichiro Tounai, Tokyo, Japan

[73] Assignee: NEC Corporation, Tokyo, Japan

[21] Appl. No.: 439,947

[22] Filed: May 12, 1995

Related U.S. Application Data

[63] Continuation of Ser. No. 283,164, Aug. 3, 1994, abandoned.

[30] Foreign Application Priority Data

Aug. 3, 1993 [JP] Japan .................. 5-191539

[51] Int. Cl.$^6$ .................................. H01L 21/66
[52] U.S. Cl. .................... 438/18; 356/401; 438/975
[58] Field of Search .......................... 356/373, 400, 356/401; 437/78, 924; 148/DIG. 102

[56] References Cited

U.S. PATENT DOCUMENTS

| | | | |
|---|---|---|---|
| 4,386,459 | 6/1983 | Boulin | 437/8 |
| 4,571,538 | 2/1986 | Chow | 437/8 |
| 4,750,836 | 6/1988 | Stein | 356/401 |
| 4,757,207 | 7/1988 | Chappelow et al. | 356/401 |
| 4,833,621 | 5/1989 | Umatate . | |
| 4,938,600 | 7/1990 | Into | 356/401 |
| 5,017,514 | 5/1991 | Nishimoto | 356/401 |
| 5,108,942 | 4/1992 | Yonezu | 437/52 |
| 5,110,753 | 5/1992 | Gill et al. | 437/52 |
| 5,156,982 | 10/1992 | Nagoya | 437/8 |
| 5,172,188 | 12/1992 | Nagoya | 356/373 |
| 5,260,599 | 11/1993 | Ponse et al. . | |
| 5,280,437 | 1/1994 | Corliss | 356/401 |
| 5,296,917 | 3/1994 | Kusonose et al. | 356/401 |

FOREIGN PATENT DOCUMENTS

| | | | |
|---|---|---|---|
| 55-113331 | 9/1980 | Japan | 437/924 |
| 57-45946 | 3/1982 | Japan | 437/924 |
| 57-103326 | 6/1982 | Japan | 437/924 |
| 61-168225 | 7/1986 | Japan | 437/924 |
| 61-185927 | 8/1986 | Japan | 437/924 |
| 62-97327 | 5/1987 | Japan | 437/924 |
| 63-29943 | 2/1988 | Japan . | |
| 1-215022 | 8/1989 | Japan . | |
| 2-56129 | 2/1992 | Japan . | |

OTHER PUBLICATIONS

Translation of JP 62-97327 (Wakamiya).
Translation of JP 55-113331 (Sakashita).

*Primary Examiner*—Charles L. Bowers, Jr.
*Assistant Examiner*—Leon Radomsky
*Attorney, Agent, or Firm*—Whitham, Curtis, Whitham & McGinn

[57] ABSTRACT

A method of fabricating a semiconductor device includes the steps of forming an inner circuit, a cell test pattern, and a superposition error measurement pattern. The inner circuit includes a plurality of recurring basic cells. The cell test pattern includes a test cell array having at least one test basic cell of the same design as the basic cells in the inner circuit and a plurality of test dummy cells disposed around the test cell array. The superposition error measurement pattern includes a first and a second pattern formed in the steps of a first and a second lithographic step, respectively, performed in the formation of the basic cells. The inner circuit, said cell test pattern and said superposition error measure pattern are integrated on the same semiconductor substrate. The method permits the formation of the test basic cell having the same proximity effect as that of the basic cells and further permits accurate monitoring of the correlation of the extent of superposition of semiconductor circuit patterns and superposition error.

9 Claims, 4 Drawing Sheets

5,627,083

METHOD OF FABRICATING SEMICONDUCTOR DEVICE INCLUDING STEP OF FORMING SUPERPOSITION ERROR MEASURING PATTERNS

This is a continuation of application Ser. No. 08/283,164 filed Aug. 3, 1994, abandoned.

BACKGROUND OF THE INVENTION

(1) Field of the Invention

This invention relates to a method of fabricating a semiconductor device, and more particularly to a method of fabricating a semiconductor device including a step of forming patterns for measuring a superposition error between two-layer patterns in different lithographic processes.

(2) Description of the Related Art

As this type of patterns, there are alignment error measurement patterns. As shown in FIG. 1, x- and y-axis alignment measurement patterns 42 and 43 are disposed around an internal circuit 41 of the semiconductor device. These x- and y-axis alignment measurement patterns are disposed near the Y- and the X-axis, respectively, with the origin at the center of the lens. Each of these alignment measurement patterns has a main and a secondary scale pattern. In a certain pattern formation step, the main (or secondary) scale pattern is provided, and in a subsequent separate pattern formation step the secondary (or main) scale pattern is provided. An alignment error between these two steps is measured. In this way, the parallel movement error of the alignment error at the lens center is measured with reduced influence of the magnification difference. Further, it is possible to reduce the rotation error by arranging a pair of y-axis alignment measurement patterns 43 and a pair of x-axis alignment measurement patterns 42 to locate at the X- and Y-axis direction ends, respectively, of the circuit pattern 41 and obtaining the average values.

As the errors of layer superposition among the individual layers there are image distortion error and magnification error due to the projecting lens, effects of wafer distortion, reticle manufacture error, etc. in addition to the parallel movement and rotation errors which are errors (alignment errors) stemming from the alignment functions provided in the exposure apparatus.

In the prior art alignment error measurement method, the influence other than the alignment errors has not been taken into consideration, and the alignment error at the lens center has been measured with the x- and y-axis alignment error measurement patterns which are distant from the lens center. Therefore, the errors other than the alignment errors are not obtained, and high accuracy superposition of layers cannot be achieved.

SUMMARY OF THE INVENTION

An object of the invention, therefore, is to overcome the problems existing in the prior art and to provide an improved method of fabricating a semiconductor device including a step of forming superposition error measuring patterns, which enables accurate monitoring of a correlation between the extents of superposition of semiconductor circuit patterns and superposition errors.

Another object of the invention is to compare the extents of superposition and superposition errors of the individual layers of test basic cell patterns and the basic memory cell patterns substantially without being affected by the lens image distortion, wafer distortion, reticle pattern relative position error, etc.

According to one aspect of the invention, there is provided a method of fabricating a semiconductor device having an inner circuit including a plurality of recurring basic cells which are formed on a semiconductor substrate through a first and a second lithographic step, the method comprising the steps of:

forming a cell test pattern at a peripheral portion of the inner circuit, including a test cell array having at least one test basic cell of the same design as the basic cells and a plurality of test dummy cells disposed around the test cell array; and forming a superposition error measurement pattern near the cell test pattern, including a first and a second pattern formed in the steps of the first and second lithographic steps, respectively, performed in the formation of the basic cells, the inner circuit, the cell test pattern and the superposition error measurement pattern being integrated on the same semiconductor substrate.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Figure 1:
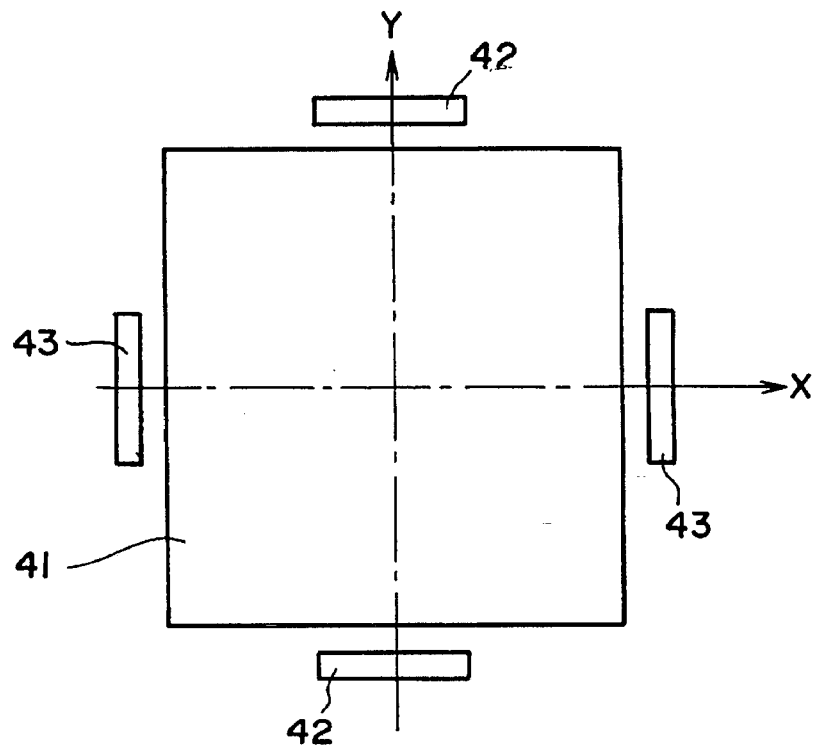
FIG. 1 is a layout view of an example of a prior art device.
Figure 2:
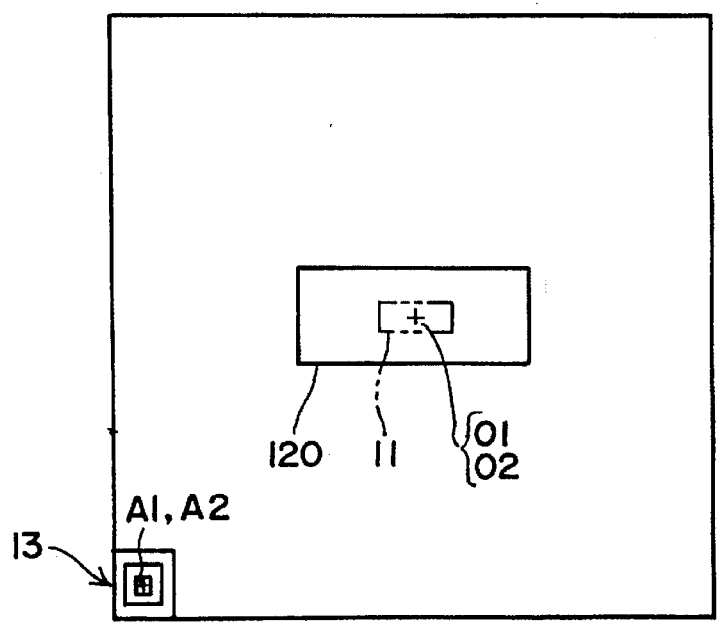
FIG. 2 is a layout view of an example of a device of a first embodiment according to the invention.

Now, embodiments of the invention will be described with reference to the drawings. FIG. 2 is a layout view for describing a first embodiment of the invention.

This embodiment comprises a step in which an internal circuit, a cell test pattern, and a superposition error measurement pattern 13 are integrated on the same semiconductor substrate. The inner circuit includes a DRAM (Dynamic Random Access Memory) cell array having a plurality of basic memory cells formed in a recurring form, the cell test pattern, formed at a peripheral portion of the inner circuit, includes a test basic memory cell 11 of the same design and dimension as the basic memory cells and the test dummy cell array 120 including a plurality of test dummy cells disposed around the test basic memory cell 11, and the superposition error measurement pattern 13 includes a first and a second pattern formed in a first and a second lithographic step (i.e., a lithographic step for the formation of a word line and another lithographic step for the formation of a bit line contact) conducted in the above basic memory cell formation.

The usual memory device includes a memory cell area having a plurality of recurring basic memory cell patterns each constituting a unit memory element and a peripheral circuit area having a circuit such as a drive circuit for driving the memory elements. In a peripheral part of the memory device, a cell test pattern is provided, which comprises the test basic memory cell 11 of the same design as the basic memory cells and the test dummy cell array 120 having eight test dummy cells disposed around the test basic memory cell 11. Further, the superposition error measurement pattern 13 is disposed near the test dummy cell array 120.

Figure 3A:
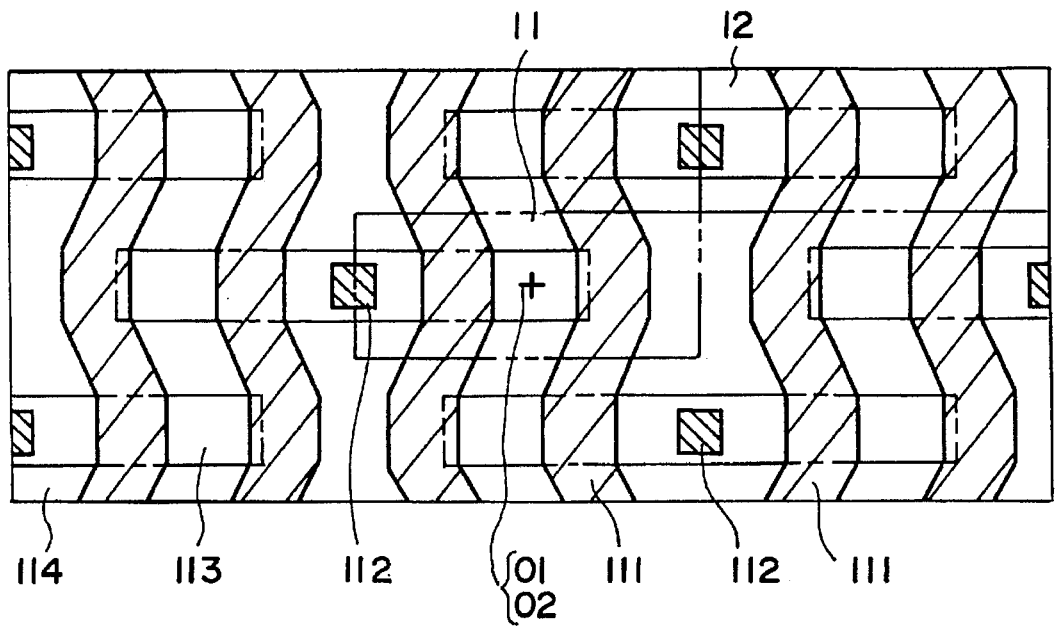
FIG. 3A is a plan view of an example of a cell test pattern in the first embodiment of the invention.

FIG. 3A is a plan view showing an example of the cell test pattern in the first embodiment. The test basic memory cell 11 comprises word lines 111 constituted by a lower layer pattern, and a bit line contact hole 112 formed in an upper layer pattern. The test dummy cell array 120 has eight test basic dummy cells 12 which are the same in shape as the test basic memory cell (array) and disposed in a point or a line symmetry around the test basic memory cell (array).

Figure 3B:
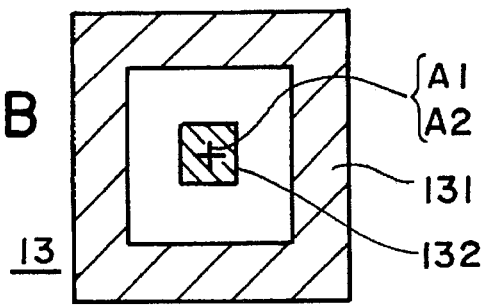
FIG. 3B is a plan view showing an example of a superposition error measurement pattern in the first embodiment of the invention.

FIG. 3B is a plan view showing an example of the superposition error measurement pattern 13 in the first embodiment. The pattern has a large frame-like lower layer pattern 131 (formed in the same step as for the word line 111) and a central square upper layer pattern 132 (formed in the same step as for the bit line contact hole 112).

Designated at O1 and A1 are positions indicative of the centers defined in relation to the lower layer patterns 111 and 131 (here the centers of rectangles), these positions being hereinafter referred to as center positions. Likewise, designated at O2 and A2 are center positions of the upper layer patterns 112 and 132. The center positions may be provided on an optical apparatus for testing patterns on semiconductor chips. In FIGS. 2, 3A and 3B, a state without a superposition error is shown, and the positions O1 and O2 and also the positions A1 and A2 are respectively the same.

While FIGS. 2, 3A and 3B show a superposition error measurement pattern which is used for measuring a superposition error between the memory cell gate electrode (word line) formation step and the bit line contact hole formation step, actually it is necessary to measure superposition errors in many steps. That is, it is necessary to provide a pattern similar to the pattern 13 for each step. For this reason, a broad area is provided for accommodating a number of superposition error measurement patterns.

To supplement the above description, the formation of the DRAM memory array will be described. A field oxide film 114 is formed selectively on the surface of p-type silicon substrate (not shown) so that an active region is defined. A gate oxide film is formed on the surface of the active region, and on this film a polysilicon film or the like is deposited and patterned to form word lines. At this time, the word lines 111 at the cell test pattern area and lower layer patterns 131 at the superposition error measurement pattern area are also formed. Then, a source and a drain region are formed by ion implantation of arsenic (As). At this time, source and drain regions 113 in the cell test pattern area are also formed. Then, an inter-layer insulating film is deposited, followed by the formation of a bit line contact hole 112 reaching either one of the source and drain regions. At this time, the cell test pattern area and the superposition error measurement pattern area are formed with bit line contact hole 112 and the upper layer pattern 132 (hole similar to the contact hole), respectively. Then, high refractory metal such as tungsten is deposited on the assembly and patterned to form a bit line.

Then, a further inter-layer insulating film is deposited and formed with a contact hole reaching the other one of the source and drain regions. Then, a lower electrode of a capacitor is formed, and an insulating film of the capacitor, an upper electrode of the capacitor, etc. are formed.

In the above way, a DRAM memory array, a cell test pattern and a plurality of superposition error measurement patterns all integrally fabricated on the same substrate are formed.

When forming a fine pattern by photolithography, the reticle pattern shape and the pattern shape projected by an exposure apparatus are slightly different in shape due to a proximity effect, and rounding or blurring occurs at the pattern end.

When forming a pattern like recurring memory cells in a memory device, a proximity effect like that in the memory cell section in the memory device may be provided by having test dummy cells 12 arranged around one test basic memory cell 11. The same is applicable to the influence of light reflection by underlying steps in the individual layers.

Then, a cell test pattern like the memory cell array in the memory device is formed around the memory device, and a superposition error measurement pattern 13 is formed in the vicinity of this pattern. The superposition error measurement pattern 13 is basically a square pattern to permit satisfactory accuracy of measurement to be obtained. With the cell test pattern and the superposition error measurement pattern 13 disposed in the vicinity of each other, it is possible to hold the distance between the patterns within 100 μm.

Figure 4:
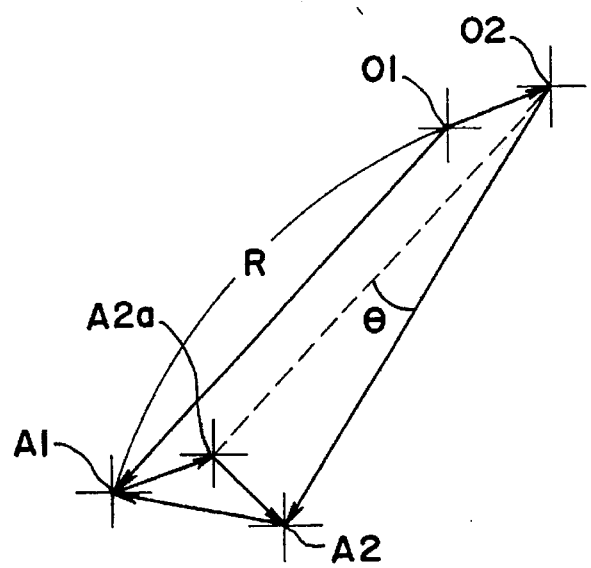
FIG. 4 is a diagram for explaining the superposition error measurement in the first embodiment of the invention.

FIG. 4 is a diagram for explaining the superposition error measurement in the first embodiment.

Denoting the center position of the lower layer pattern 111 of the test basic memory cell pattern 11 by O1 and the center position of the upper layer pattern 112 by O2, the superposition error between the lower and upper layers of the basic cell pattern is represented by a vector O1-O2.

Also, by denoting the center position of the lower pattern 131 of the superposition error measurement pattern 13 by A1 and the center position of the upper layer pattern 132 by A2, the superposition error of the superposition error measurement pattern 13 is represented by a vector A1-A2.

The distance between the positions O1 and A1 is R which is set to 100 μm or below, that is, $$|vector\ O1\text{-}A1|=R<100\ \mu m.$$

Denoting the position A2 in an ideal state, which is free from rotation error due to the alignment of the exposure apparatus, image distortion error (such as magnification error) due to the projecting lens or the like and reticle position error due to reticle manufacture errors or the like between the lower and upper layer patterns, by A2a, the vectors O1-A1 and O2-A2a are equal in magnitude and parallel, that is, $$vector\ O1\text{-}A1 = vector\ O2\text{-}A2a.$$

Thus, the superposition error vector O1-O2 of the test basic cell memory pattern and the superposition error vector A1-A2a of the superposition error measurement pattern are equal in magnitude and parallel, that is, $$vector\ O1\text{-}O2 = vector\ A1\text{-}A2a.$$

Actually, however, there is a deviation from the ideal position A2a to the actual position A2 due to the influence of the errors noted above. This deviation (i.e., vector A2a-A2) usually may be reduced by reducing the distance R between the positions O1 and A1. For example, when the deviation (|vector A2a-A2|) is based on the rotation error $\theta$ in the alignment and the magnification error m of the projecting lens, it is approximately given as follows:

$$\begin{aligned}\theta|\text{vector } O2\text{-}A2a| + \\ m|\text{vector } O2\text{-}A2a|\end{aligned} = (\theta + m)|\text{vector } O1\text{-}A1|$$

$$= (\theta + m)R$$

Since $\theta$ and m are several ppm and R is 100 μm or below, $$|\text{vector } A2a\text{-}A2| < 10 \text{ ppm } \theta 100 \text{ μm} = 1 \text{ nm}.$$

The error is thus 1 nm or below. The superposition error (|vector O1-O2|) is usually about 100 nm. Compared to this value, the deviation noted above may be made as small as negligible. Likewise, the image distortion, wafer distortion and relative position error due to reticle manufacture errors may be made to be as small as negligible by reducing the distance R. For this reason, the cell test pattern and the superposition error measurement pattern 13 may be thought to be formed with the same superposition error. It is thus possible to compare directly and accurately the relation between the extent of superposition of the pattern in the test basic memory cell 11 and the superposition error.

Figure 5:
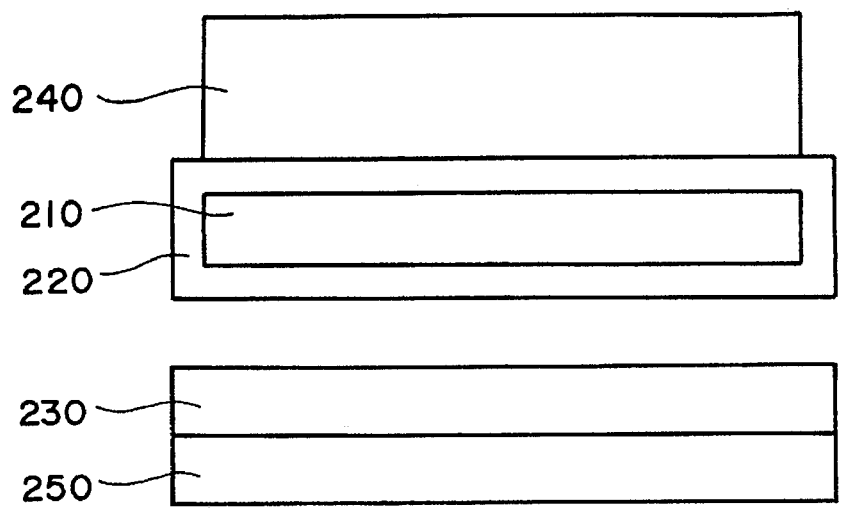
FIG. 5 is a layout view of a device of a second embodiment according to the invention.

FIG. 5 is a layout view for describing a second embodiment of the invention.

In this embodiment, there are formed a cell test pattern which includes a test cell array 210, a test dummy cell array 220 having a plurality of test dummy cells disposed around the test cell array 210 and a terminal pattern 240 having terminals for measuring electric characteristics of the test cell array, a superposition error measurement pattern 230 disposed in the vicinity of the cell test pattern and an electric characteristic test pattern 250.

Figure 6:
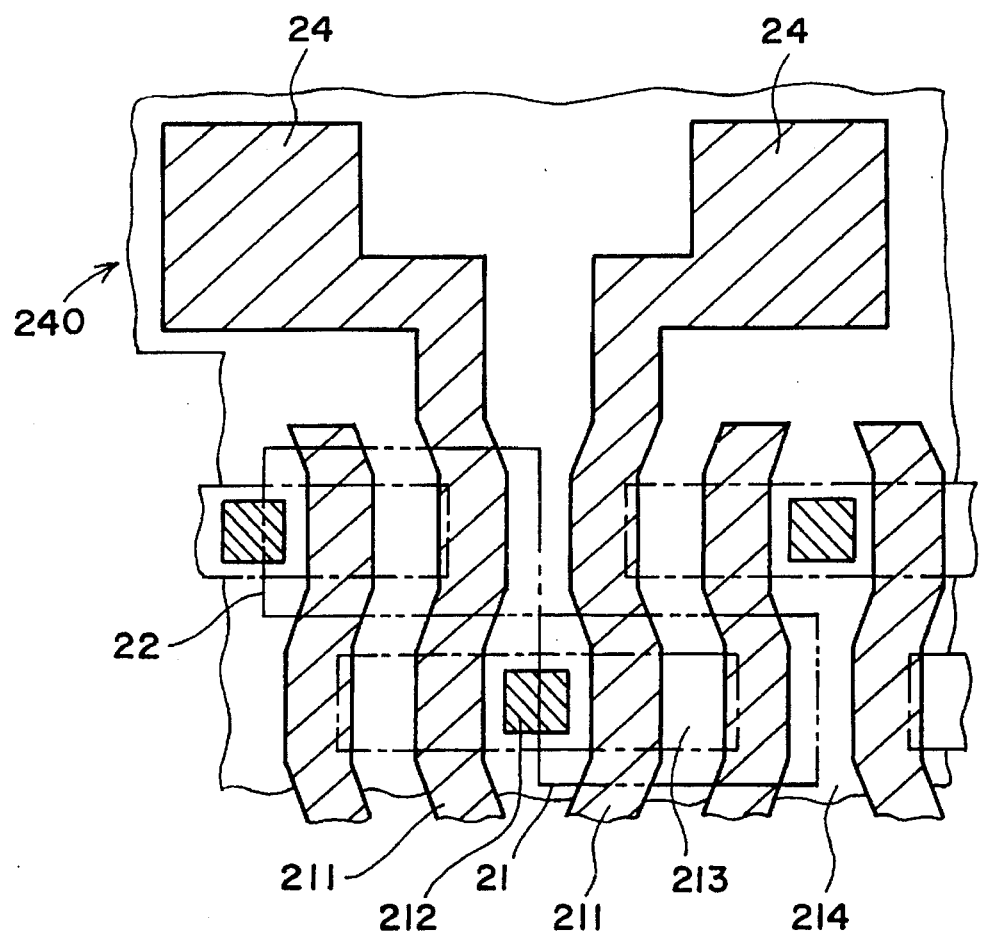
FIG. 6 is a plan view of an example of a cell test pattern in the second embodiment of the invention.

FIG. 6 shows an example of the test pattern. In this example, a test cell array is formed by forming a plurality of recurring test basic memory cells 21 like that in the first embodiment in a predetermined one direction. Also, a test dummy cell array is formed by positioning test dummy cells 22 around the test cell array. Further, gate terminals 24 are provided to the word lines 211 formed on the opposite sides of the bit line contact hole 212, thus forming a terminal pattern 240 shown in FIG. 5. It is thus possible to obtain measurement of the gate-substrate leakage currents or the like.

Figure 7:
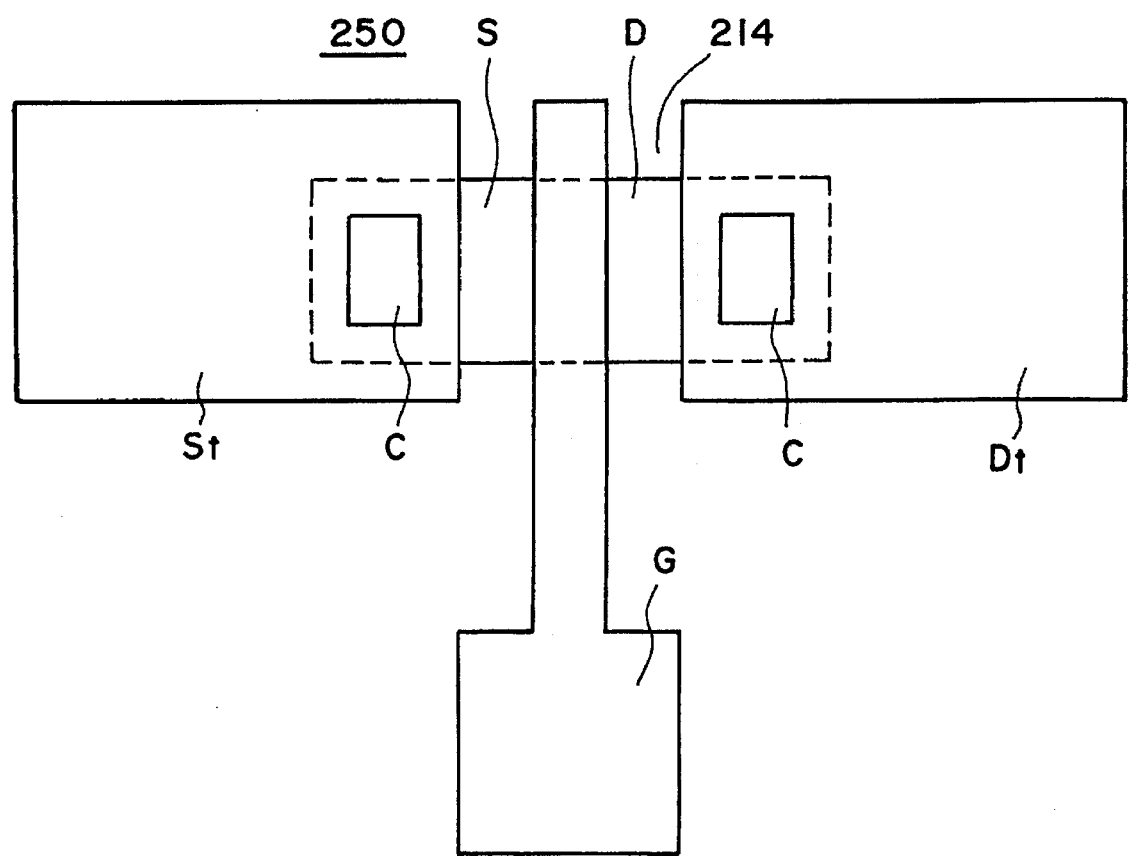
FIG. 7 is a plan view of an example of an electric characteristic test pattern in the second embodiment of the invention.

FIG. 7 shows an example of the electric characteristic test pattern 250 shown in FIG. 5. This pattern is for measuring the threshold voltage of a MOS (Metal Oxide Semiconductor) transistor. A gate electrode G is formed in the same step as for the memory cell word lines. The length and width of the gate G are set to be equal to those of the MOS transistor in the basic memory cell. Designated at D is a drain region, and at S is a source region. These regions are formed in the same step as the source and drain regions 213 of the basic memory cell. A contact hole C is formed in the same step as for the bit line contact hole 212. The drain and source electrode terminals Dt and St are formed in the same step as for the bit lines. The quantity of impurity introduced in an impurity introduction step can be monitored with threshold voltage measurement.

In this embodiment, it is possible to separate the influence of alignment errors on the electric characteristics of the element in the cell from the influence of the individual processes thereon.

As has been described in the foregoing, according to the invention, a cell test pattern is formed by positioning dummy cells around a test cell array including at least one test basic cell of the same desitin as the basic memory cell. Thus, it is possible to form a test basic cell which has the same proximity effect as the basic memory cells, and the basic memory cell can be monitored accurately. In addition, since the superposition error measurement pattern is disposed in the vicinity of the cell test pattern, it is possible to compare the extents of superposition and superposition error of the individual layers of the test basic cell pattern and the basic memory cell pattern substantially without being affected by the lens image distortion, wafer distortion and reticle pattern relative position error. The superposition error tolerance thus can be set accurately. Thus, it is possible to obtain further improvement of the reliability and production yield of the semiconductor device.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of fabricating a semiconductor device having an inner circuit including a plurality of recurring basic cells which are formed on a semiconductor substrate through a first and a second lithographic step, said method comprising steps of:

forming a cell test pattern at a peripheral portion of said inner circuit, including a test cell array having at least one test basic cell of a same design and being subject to a same proximity effect as said basic cells and a plurality of test dummy cells of the same design as said basic cells, placed in a same disposition as said basic cells around said test cell array within said inner circuit and used solely for testing purposes and possessing a same light reflection influence as that of said basic cells; and forming a superposition error measurement pattern which is disposed in the vicinity of said cell test pattern, including a first and a second pattern formed in the steps of said first and second lithographic steps, respectively, performed in the formation of said basic cells, such that a measurement is substantially free of image distortion, wafer distortion, and reticle manufacture errors, said inner circuit, said cell test pattern and said superposition error measurement pattern being integrated on the same semiconductor substrate; and performing a superposition error measurement using said basic test cell and said superposition error measurement pattern.

2. The method of fabricating a semiconductor device according to claim 1, wherein said first and said second pattern are fabricated in the same steps as for a lower layer pattern and an upper layer pattern of said basic cells in said inner circuit.

3. The method of fabricating a semiconductor device according to claim 1, wherein said step of forming said superposition error measurement pattern includes a step of forming said first pattern of said superposition error measurement pattern to have a square frame, and a step of forming the second pattern of said superposition error measurement pattern to be within the square frame.

4. The method of fabricating a semiconductor device according to claim 1, wherein a distance between said cell test pattern and said superposition error measurement pattern is set within 100 micrometers.

5. The method of fabricating a semiconductor device according to claim 1, wherein said plurality of test dummy cells are disposed in a point symmetry around said test basic cell.

6. The method of fabricating a semiconductor device according to claim 1, wherein said plurality of test dummy cells are disposed in line symmetry around the test basic cell.

7. The method of fabricating a semiconductor device according to claim 1, wherein said test dummy cells are provided with terminals for measuring electric characteristics.

8. The method of fabricating a semiconductor device according to claim 3, wherein said test dummy cells are provided with terminals for measuring electric characteristics.

9. A method of fabricating a semiconductor device having an inner circuit including a plurality of recurring basic cells which are formed on a semiconductor substrate through a first and a second lithographic step, said method comprising steps of:

forming a cell test pattern at a peripheral portion of said inner circuit, including a test cell array having at least one test basic cell of a same design and being subject to a same proximity effect as said basic cells and a plurality of test dummy cells of the same design as said basic cells, placed in a same disposition as said basic cells around said test cell array within said inner circuit and used solely for testing purposes and possessing a same light reflection influence as that of said basic cells;

forming a superposition error measurement pattern which is disposed in the vicinity of said cell test pattern, including a first and a second pattern formed in the steps of said first and second lithographic steps, respectively, performed in the formation of said basic cells, such that a measurement is substantially free of image distortion, wafer distortion, and reticle manufacture errors, said inner circuit, said cell test pattern and said superposition error measurement pattern being integrated on the same semiconductor substrate; and performing a superposition error measurement using said basic test cell and said superposition error measurement pattern, wherein said measurement is substantially free from image distortion, wafer distortion, and reticle manufacturing errors when a separation between said basic test cell and said superposition error measurement pattern is 100 microns or less.

* * * * *